(12) United States Patent
Murgai et al.

(10) Patent No.: US 7,890,904 B2
(45) Date of Patent: Feb. 15, 2011

(54) ESTIMATING JITTER IN A CLOCK TREE OF A CIRCUIT AND SYNTHESIZING A JITTER-AWARE AND SKEW-AWARE CLOCK TREE

(75) Inventors: Rajeev Murgai, Santa Clara, CA (US); William W. Walker, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 547 days.

(21) Appl. No.: 11/421,988

(22) Filed: Jun. 2, 2006

(65) Prior Publication Data

US 2006/0288320 A1 Dec. 21, 2006

Related U.S. Application Data

(60) Provisional application No. 60/687,740, filed on Jun. 6, 2005.

(51) Int. Cl.
*G06F 9/45* (2006.01)
*G06F 17/50* (2006.01)

(52) U.S. Cl. .......................................................... 716/6
(58) Field of Classification Search ........................ 716/6
See application file for complete search history.

(56) References Cited

U.S. PATENT DOCUMENTS

2003/0115017 A1* 6/2003 Sun et al. ..................... 702/181
2004/0123259 A1* 6/2004 You et al. ....................... 716/6
2005/0027477 A1* 2/2005 Li et al. ....................... 702/181
2005/0066298 A1* 3/2005 Visweswariah ................ 716/6
2006/0230373 A1* 10/2006 Dirks et al. .................... 716/6
2006/0247906 A1* 11/2006 Austin et al. .................. 703/16

FOREIGN PATENT DOCUMENTS

CN 2003-216676 7/2003

OTHER PUBLICATIONS

Agarwal et al., "Statistical Clock Skew Analysis Considering Intradie-Process Variations," IEEE Transactions on Computer-Aided design of Integrated Circuits and Systems, vol. 23, No. 8, pp. 1231-1242, Aug. 2004.

(Continued)

*Primary Examiner*—Jack Chiang
*Assistant Examiner*—Suresh Memula
(74) *Attorney, Agent, or Firm*—Baker Botts L.L.P.

(57) ABSTRACT

In one embodiment, a method for computing jitter in a clock tree includes dividing a clock tree into a plurality of stages and computing jitter in one or more of the stages according to a model of at least a portion of a circuit associated with the clock tree. The model includes a representation of each source of jitter in the circuit. The method also includes, to compute jitter associated with a path or a pair of paths in the clock tree, statistically combining the jitter in each of the stages of the path or the pair of paths in the clock tree with each other.

In one embodiment, to efficiently compute jitter and to achieve zero clock skew, a method synthesizes a symmetrical clock tree of a circuit in which corresponding stages in all paths from a root of the clock tree to sinks of the clock tree exhibit approximate electrical equivalence to each other.

13 Claims, 4 Drawing Sheets

OTHER PUBLICATIONS

Boning et al., "Models of Process Variations in Device and Interconnect," Design of High Performance Microprocessor Circuits, Chapter 6, pp. 99-116, Dec. 5, 2000.

Borkar et al., "Parameter Variations and Impact on Circuits and Microarchitecture," DAC Jun. 2-6, 2003, pp. 338-342.

Bowman et al., "Impact of Die-to-Die and Within-Die Parameter Fluctuations of the Maximum Clock Frequency Distribution for Gigascale Integration," In IEEE Journal of Solid-State Circuits, pp. 183-190, Feb. 2002.

Chinnery et al., "Closing the Gap Between ASIC and Custom: An ASIC Perspective," DAC 2000, pp. 637-642.

Feller et al., "An Introduction to Probability Theory and its Applications," vol. II, Wiley Eastern University Addition, 1966, pp. 217-246.

Hitchcock, Robert, "Timing Verification and the Timing Analysis Program," DAC Jun. 1982, pp. 504-604.

Jyu et al., "Statistical Timing Analysis of Combinational Logic Circuits," IEEE Transactions on a Very Large Scale Integration (VLSI) Systems, vol. 1, No. 2, pp. 126-137, Jun. 1993.

Liu et al., "Impact of Interconnect Variations on the Clock Skew of a Gigahertz Microprocessor," In DAC, pp. 168-171, Jun. 2000.

Berkelaar, M., "Statistical Delay Calculation, A Linear Time Method," in TAU, pp. 15-24, Dec. 1997.

Orshansky et al., "Fast Statistical Timing Analysis Handling Arbitrary Delay Correlations," In DAC, pp. 337-342, Jun. 2004.

Orshansky et al., "Impact of Systematic Spatial Intra-Chip Gate Length Variability on Performance of High-Speed Digital Circuits," In ICCAD, pp. 62-67, Nov. 2000.

Papadimitriou et al., "Combinatorial Optimization: Algorithms and Complexity," Prentice-Hall, Englewood Cliffs, New Jersey, 1982, pp. 101-124.

Samaan, S.B., "The Impact of Device Parameter Variations on the Frequency and Performance of VLSI Chips," In ICCAD, pp. 343-346, 2004.

Visweswariah et al., First-Order Incremental Block-Based Statistical Timing Analysis, in DAC, pp. 331-335, Jun. 2004.

Zanella et al., "Analysis of the Impact of Process Variations on Clock Skew," In IEEE Trans. on Semiconductor Manufacturing, pp. 401-407, Nov. 2000.

Zuchowski et al., "Process and Environmental Variation Impacts on ASIC Timing," In ICCAD, pp. 336-342, 2004.

The State of Intellectual Property Office of China, "First Notification of Office Action," Patent Application No. 2006-10088599.4, Issued Oct. 26, 2007, 3 pages, Received Nov. 27, 2007.

* cited by examiner

| PARAMETERS | 3σ VARIATIONS |
|---|---|
| NMOS/PMOS CHANNEL LENGTH | 0.008μ |
| NMOS/PMOS THRESHOLD VOLTAGE | 20mV |
| TEMPERATURE | 20C |
| $V_{dd}$ | 10.00% |
| CROSSTALK SWITCHING PROBABILITY | 0.5 |

FIG. 6

| START | END | τavail(START, END) |
|---|---|---|
| $FF_1$ | $FF_2$ | $\tau + t_4 - t_3 - 3\sqrt{\sigma^2_{PLL} + 2\sigma^2_{1VX} + 2\sigma^2_{2VX} + \sigma^2_3 + \sigma^2_4}$ |
| $FF_1$ | $FF_3$ | $\tau + t_5 + t_6 - t_2 - t_3 - 3\sqrt{\sigma^2_{PLL} + 2\sigma^2_{1VX} + \sigma^2_2 + \sigma^2_3 + \sigma^2_5 + \sigma^2_6}$ |
| $FF_4$ | $FF_5$ | $\tau - 3\sqrt{\sigma^2_{PLL} + 2\sigma^2_{1VX} + 2\sigma^2_{6VX} + 2\sigma^2_{7VX}}$ |

FIG. 7

| START | END | Tclk(END) - Tclk(START) FOR RACE ANALYSIS |
|---|---|---|
| $FF_1$ | $FF_2$ | $t_4 - t_3 + 3\sqrt{\sigma^2_3 + \sigma^2_4}$ |
| $FF_1$ | $FF_3$ | $t_5 + t_6 - t_2 - t_3 + 3\sqrt{\sigma^2_2 + \sigma^2_3 + \sigma^2_5 + \sigma^2_6}$ |
| $FF_4$ | $FF_5$ | 0 |

ESTIMATING JITTER IN A CLOCK TREE OF A CIRCUIT AND SYNTHESIZING A JITTER-AWARE AND SKEW-AWARE CLOCK TREE

RELATED APPLICATIONS

This application claims the benefit under 35 U.S.C. §119(e) of U.S. Provisional Application No. 60/687,740 filed Jun. 6, 2005, entitled "An Efficient Jitter- and Skew-Aware Methodology for Clock Tree Synthesis and Analysis."

TECHNICAL FIELD OF THE INVENTION

This invention relates in general to circuit design and more particularly to estimating jitter in a clock tree of a digital circuit and synthesizing a skew- and jitter-aware clock tree.

BACKGROUND OF THE INVENTION

As the scale of integrated circuits increases, the effects of process and environment (such as, for example, voltage, temperature and crosstalk) tend to increase variation in delay throughout such circuits. Such variation increases clock jitter (or uncertainty in the clock arrival time at a flip-flop) in the circuits. Increases in jitter reduce maximum allowable delays in critical paths in the circuits for fixed clock cycles, which makes more aggressive optimization and greater turn-around time more important.

BRIEF DESCRIPTION OF THE DRAWINGS

To provide a more complete understanding of the present invention and features and advantages thereof, reference is made to the following description, taken in conjunction with the accompanying drawings, in which.

DESCRIPTION OF EXEMPLARY EMBODIMENTS

Figure 1:
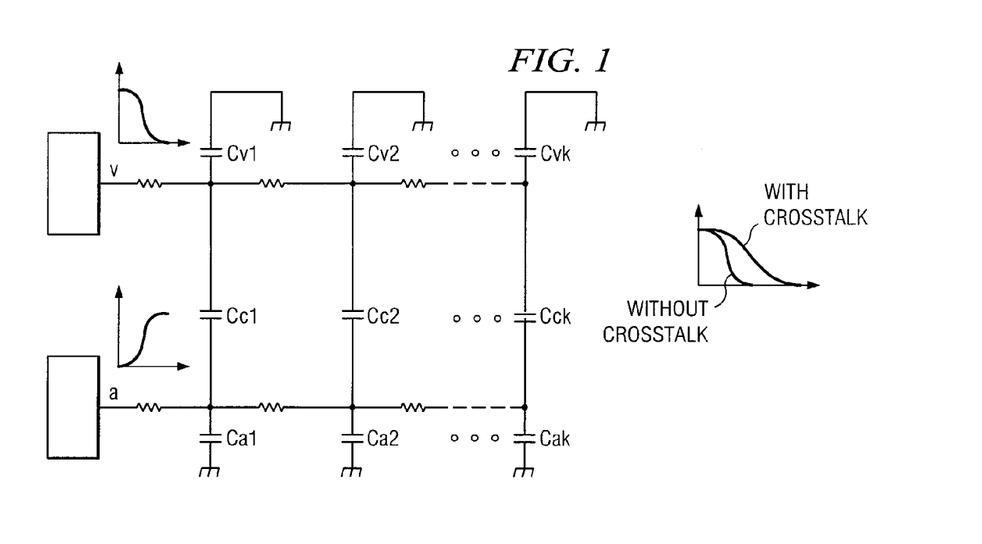
FIG. 1 illustrates example crosstalk.

FIG. 1 illustrates example crosstalk. In deep sub-micron circuit designs, as wires have become taller and narrower while distances separating them from each other has decreased, coupling capacitance between adjacent interconnects has become a significant problem. As a result, crosstalk noise between physically adjacent nets (or interconnects) has become a significant problem. An affected net is a victim, v. A neighboring switching net causing noise affecting the victim v is an aggressor, a. Reference to an aggressor a encompasses one or more such nets, where appropriate. As FIG. 1 illustrates, when the aggressor a switches in a direction opposite the victim v, crosstalk may increase an arrival time at the victim v. When the aggressor a switches in the same direction as the victim v, crosstalk may decrease an arrival time at the victim v. Distributed coupling capacitance between v and a is shown as $C_c i$. Crosstalk may also result in logic hazards and circuit malfunction. For instance, if the delay change is large enough to render a critical path slower than the clock cycle (and thus cause a timing violation) or the large spike generated on the victim v due to capacitive coupling with an aggressor a is close enough to the clock edge to latch a wrong value at the target flip flop (FF), the circuit may malfunction. Accurate computation of the delay change due to crosstalk becomes important in the circuit design process. Particular embodiments of the present invention address this problem in the context of chip-level design and compute accurate path delays in the presence of crosstalk coupling.

Traditional design practices and static timing analysis (STA) tools handle clock jitter by reserving a pessimistic delay margin for each buffer in the clock tree. As the worst-case analysis, they add up these margins for buffers on a path in the clock tree. Then, depending on whether the clock path is to the source FF or target FF, the total margin is either added to or subtracted from the nominal path delay. Such worst-case analysis is overly pessimistic, since it assumes minimum delay conditions (i.e., minimum temperature, maximum supply voltage, minimum channel length, and minimum threshold voltage) for all the buffers on one clock path, and maximum delay conditions (i.e., maximum temperature, minimum supply voltage, maximum channel length, and maximum threshold voltage) for the buffers on the other clock path. The use of such highly improbable scenarios results in unnecessary circuit over-design. The majority of manufactured chips show more than 30% higher performance than predicted by the tools.

Statistical static timing analysis (SSTA) is an alternate paradigm for more realistic timing verification. Broadly, two kinds of approaches have been proposed for SSTA: analytical and sampling-based. An analytical approach takes as input the statistical gate delay models (e.g., in the form of Gaussian probability density functions) and statistical process variation models, and constructs probabilistic density function (PDF) of the circuit or path delays. Due to the mathematical complexity involved (e.g., of deriving the max and min of PDFs), these are still a topic of research. Sampling-based or Monte Carlo (MC)-based techniques generate values for input parameters, assuming that the parameters satisfy some distribution (e.g., uniform or Gaussian). The circuit delay is computed under these values. The procedure is repeated hundreds or thousands of times till enough delay values are obtained for a delay distribution curve. MC-based techniques are highly accurate but computationally intensive. It may not be possible to apply them directly to real industrial designs.

In particular embodiments, a methodology for clock tree jitter analysis combines analytical and Monte Carlo approaches. In particular embodiments, a tree synthesis technique generates a zero-skew tree. Jitter analysis on this tree is more efficient than traditional MC based approaches and less pessimistic than traditional STA. In particular embodiments, the methodology is applicable to clock tree synthesis and analysis for an Ethernet chip under process, temperature, voltage and crosstalk variations.

Given a clock tree and source and target FFs, particular embodiments employ a statistical and less pessimistic methodology (as compared with the worst case methodology) for computing clock jitter. In this methodology, the delay variation (or jitter) for each buffer stage of the clock tree is accurately computed with SPICE using Monte Carlo simulations.

The jitters of the stages are then combined statistically to yield the jitter for the complete clock path (or a pair of paths) rather than simply adding the jitters (as done in traditional STA tools). Particular embodiments synthesize a clock tree on which the above stage-jitter computation and tree jitter analysis may be carried out efficiently.

In particular embodiments, a clock jitter analysis algorithm analyzes jitter between source and target FFs of a data path. In particular embodiments, a post-processing scheme reanalyzes critical paths of a design reported by traditional STA tools using statistical jitter computation on the clock tree.

Given a fixed cycle time, clock skew and jitter together reduce the maximum allowable delay of a critical path in the design. Skew is the deterministic difference in clock arrival times $t_i$ and $t_j$ for two given flip-flops $FF_i$ and $FF_j$. Skew is traceable to mismatches (imperfect or deliberate) in the clock distribution network in the absence of any process, voltage, or temperature variations, and with all noise sources zeroed. Skew may be calculated by building an accurate model of the clock distribution network, then performing a SPICE or STA simulation from the clock source to every FF on the clock tree at a constant temperature and $V_{dd}$, and measuring the nominal clock delay t from 50% of $V_{dd}$ at the clock source to 50% of $V_{dd}$ at each FF. Therefore, calculating clock skew may be the same as calculating the clock delays and arrival times and then computing the differences.

Jitter is the uncertainty or time-variation in a parameter of interest. In the context of a clock, the parameter of interest is the clock arrival time at a flip-flop. If the clock cycle is $\tau$, ideally the rising (and falling) edges of the clock in any two consecutive cycles are $\tau$ time units apart at a FF. However, in practice, this time gap may vary, often due to the following reasons.

1. Supply noise or $V_{dd}$-$V_{ss}$ variation at a gate as a function of time. The supply noise is caused by different sets of gates switching in different clock cycles. This results in time-varying currents on the $V_{dd}$ and $V_{ss}$ lines and hence IR and Ldi/dt drops. Since the delay of a gate depends on $V_{dd}$, any change in the supply voltage on a clock buffer changes the clock arrival time at the FF.
2. Temperature variation at a gate and across the die. Temperature variations arise because power and temperature are strongly coupled to each other, especially for leakage-dominant technologies. A block with higher switching activity will dissipate higher dynamic power, leading to higher local temperatures. That, in turn, increases the leakage power dissipation, causing further increase in the total power. This can introduce significant temperature gradients across the chip. Temperature variation at a gate is also due to different switching activities in different cycles. A gate operating at a higher temperature exhibits higher delay due to decrease in carrier mobility.
3. Crosstalk noise. As illustrated in FIG. 1, delay of a clock wire can change if there is an aggressor a that is physically close to v and is switching. Since the aggressor's switching behavior can change from one cycle to the next, it can lead to jitter on the victim. Clock is one of the most important signals in the design. $V_{dd}/V_{ss}$ shielding is typically done on both sides of the clock to eliminate such crosstalk impact. Shielding, however, does not prevent crosstalk from the top and bottom layers, when a wide bus is going over the clock line.
4. PLL jitter. The clock generated from the PLL has some inherent jitter.
5. Process variations across a die. Examples of process variations include intrinsic variations such as random dopant fluctuations in the channel region of a MOSFET and extrinsic variations such as channel length or oxide thickness variations. Also, in a chemical mechanical planarization (CMP) process, interconnect width, thickness, spacing and height may vary significantly from the intended values. These variations cause gate or wire delays to deviate from their desired values. It is difficult to predict the precise magnitude of variations and hence the exact values of wire and gate delays after manufacturing. This phenomenon is not captured in skew. It is more convenient to model it as jitter, even though there are no significant time-dependent changes in the dimensions of a transistor or interconnect once the chip is manufactured.

Figure 2:
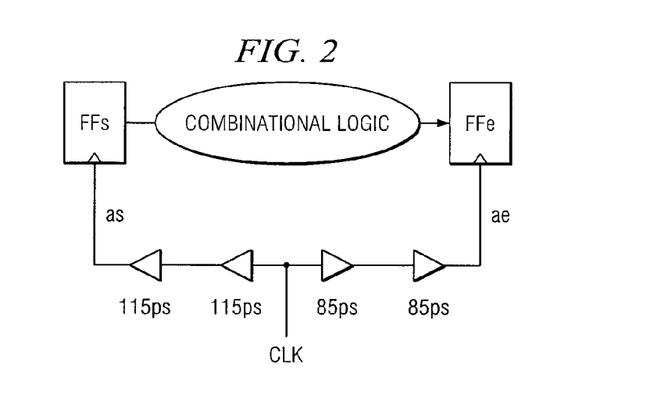
FIG. 2 illustrates an example data path and an example clock tree for the data path.

Assume a data path starting at flip-flop $FF_s$ going through combinational logic and ending at $FF_e$, as illustrated in FIG. 2. Let $a_s$ and $a_e$ be the clock arrival times at $FF_s$ and $FF_e$ respectively. These arrival times include nominal delays and jitter. Let $\tau$ be the PLL clock cycle time. In particular embodiments, the two basic functions of STA are detecting long paths and detecting races.

1. Detecting long paths. In this analysis, given start and end $FF_s$ and $FF_e$ respectively, if $d_{max}$ is the maximum path delay in the combinational logic (including the delay through $FF_s$), the following inequality should be satisfied for the circuit to work correctly.

$$a_s + d_{max} \leq a_e + \tau - t_{set\text{-}up} \quad (1)$$

The STA tool finds $\tau_{avail}(s,e)$, the minimum available cycle time between the two FFs, i.e.:

$$\tau_{avail}(s,e) = \tau + a_e - a_s. \quad (2)$$

For simplicity, Equation 2 assumes the set-up time for $FF_e$ is zero. Then, STA determines if $d_{max}$ is at most $\tau_{avail}(s,e)$. For this analysis, the receiving flip-flop capturing clock edge is one cycle after the sending flip-flop clock edge. Therefore, PLL (or other clock source) cycle jitter should be included in the analysis.

2. Detect races. In this analysis, the STA tool finds the largest clock arrival time difference of the same clock edge between $FF_s$ and $FF_e$. Then it determines if $d_{min}$, the minimum logic delay between the flip-flops, is short enough to violate the hold-time of the receiving flip-flop, $t_{hold}$, less the clock arrival time difference. In other words, for correct operation:

$$a_s + d_{min} \geq a_e + t_{hold} \quad (3)$$

Traditional STA tools such as PrimeTime handle clock jitter by reserving a pessimistic delay margin for each buffer in the clock tree. This margin depends on the technology, process, switching activity in the design, $V_{dd}$, layout, etc. For example, let the nominal delay of a buffer be 100 ps and the margin that accounts for variations be 15%. Then, the minimum delay of the buffer is 85 ps and the maximum delay is 115 ps. During long path analysis, STA tools subtract these margins from the nominal delays for the buffers on the path from clock source clk to $FF_e$ and add these margins to the buffers on the path from clk to $FF_s$. FIG. 2 shows these delays. Although the two clock paths were designed to have zero skew, the total jitter margin turns out to be 60 ps. Such worst-case analysis is overly pessimistic, since it assumes maximum delay conditions (e.g., maximum temperature, minimum supply voltage, maximum channel length, and maximum threshold voltage) for each buffer on the path from clk to $FF_s$ and minimum delay conditions (e.g., minimum temperature, maximum supply voltage, minimum channel length, and minimum threshold voltage) for buffers on the path from clk to $FF_e$.

Particular embodiments replace an overly pessimistic worst-case analysis with statistical analysis. Particular embodiments also compute the jitter of a tree stage using SPICE and Monte Carlo analysis, instead of using a pessimistic margin.

Figure 3:
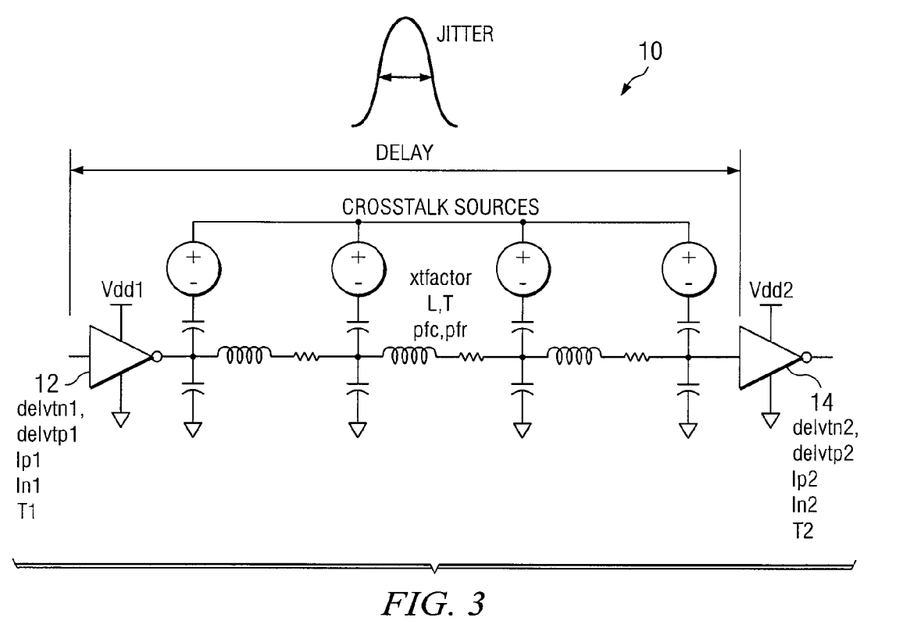
FIG. 3 illustrates an example simulation model for clock-tree stage jitter.

FIG. 3 illustrates an example simulation model 10 for clock-tree stage jitter. In particular embodiments, inverting buffer 12 drives inverter 14 through a wire.

1. Supply Noise V: Supply noise may be modeled by supplying independent power supplies to each buffer in the design, and allowing them to vary randomly according to a noise model. The amount of variation may be controlled by a user input parameter, supply_tolerance.
2. Temperature Variation T: Rising temperature causes CMOS circuits to operate more slowly, and wiring resistances to increase. Temperature variation of transistors is modeled by specifying an underlying temperature for the entire chip and then applying random local temperature variations on each clock buffer and interconnect. The variation to apply may be given by a user input parameter, max_deltemp.
3. Crosstalk Noise X: Crosstalk noise may be modeled by attaching external noise sources to the wire model in FIG. 3 and by applying random inputs at these sources based on some probability distribution. The crosstalk factor associated with the instances should also be defined each time a wire is instantiated. The crosstalk factor is a unique property of each design and is therefore supplied by the user, using the parameter xtfactor.
4. PLL jitter: Particular embodiments assume a maximum PLL jitter of $3\sigma_{PLL}$.
5. Process Variation Y: As FIG. 3 illustrates, process variation of transistors may be modeled using only channel length ($l_p$ and $l_n$ for PMOS and NMOS transistors respectively) and threshold voltage (delvt$_n$ and delvt$_p$). Other variations, such as oxide thickness and dopant concentration, have the overall effect of varying the threshold voltage and hence may be included in model 10. The variations of threshold voltage and channel lengths may be passed into each instance of the buffer sub-circuit models. Process variation of wiring may be modeled by applying random process factors to the wiring capacitance and resistance in the wire models ($pf_c$ and $pf_r$). The amount of process variation is a property of the process being used and is not alterable by the user.

On an actual chip, the supply voltages (as well as temperatures) of components located close to each other may be correlated. For instance, if two buffers are physically next to each other and are connected to the same power supply line, their $V_{dd}$ and temperature values are almost identical. It is possible to incorporate such correlation in model 10. For instance, one scheme may be to divide the chip into regions $R_i$ based on the $V_{dd}/V_{ss}$ distribution architecture and layout. Each region $R_i$ could have a mean voltage value $V_{ddi}$, which is calculated from the power architecture and the switching activity in the region. A random variable is used to compute $\Delta V_{ddi}$ for the center of the region for each simulation. A distance-based correlation function $f$ can then be used to compute the voltage for each buffer in the region as $f(V_{ddi}+\Delta V_{ddi}, l)$, where l is the distance of the buffer from the center of $R_i$. Particular embodiments do not use the worst-case paradigm, but a more realistic one. The user may be free to provide such a model, and the model may be incorporated into the methodology.

Given this unified statistical model incorporating PVTX variations, particular embodiments use Monte Carlo Simulation (MCS) with SPICE to generate mean t and standard deviation $\sigma$ of the delay. If MCS were run on the entire clock tree of a chip-level design, the model may not fit into memory or MCS may take a substantially long time to finish. Particular embodiments use a methodology in which MCS is carried out on small portions or stages of the tree. One natural definition of a tree stage (or section) is a clock buffer on the tree driving another buffer or a FF through a wire, as shown in FIG. 3. Although not shown in FIG. 3, any branch points on the wire along with the next-level buffer or FF are also included in the stage. The clock tree is thus divided into stages and MCS is carried out on each stage with SPICE. Each of the parameters $\Delta vt_{ni}$, $\Delta vt_{pi}$, $l_{pi}$, $l_{ni}$, $V_{ddi}$, $T_i$ (i=1, 2), T, $pf_c$, $pf_r$, and the crosstalk voltage sources themselves (as shown in FIG. 3) may be chosen randomly from a Gaussian distribution function at each simulation. Then the delay may be calculated from the input of the driving buffer 12 to the input of the driven buffer 13. The simulation may be repeated approximately 100-1000 times, depending on the precision required. From these simulations, SPICE may automatically calculate the mean delay t and standard deviation $\sigma$ of each stage. The jitter of a stage may be defined as $3\sigma$.

Having computed the mean delay and jitter values for all stages of the clock tree, the jitter value may be computed for a path or a pair of paths on the clock tree. For this, consider the example clock tree illustrated in FIG. 4. There are three data paths: from $FF_1$ to $FF_2$, from $FF_1$ to $FF_3$, and from $FF_4$ to $FF_5$. Each clock inverter stage is labeled with its nominal delay $t_i$ and the standard deviation $\sigma_i$. Each $\sigma_i$ takes into account all the four sources: process (P), supply voltage (V), temperature (T) and crosstalk (X). Another jitter component, $\sigma_{iVX}$, is the standard deviation in the delay due to variations in supply voltage and crosstalk only. Let the PLL cycle time be $\tau$, and its jitter be $3\sigma_{PLL}$. Particular embodiments rely on the assumption that, for each stage, delay is uncorrelated with (or independent of) any other stage and is also uncorrelated with itself for consecutive cycles. This assumption may be verified by computing the standard deviation $\sigma_1$ and $\sigma_2$ for two consecutive stage delays as well as the $\sigma$ for delay of the chain composed of these two stages, with parameter variations shown in FIG. 5. In particular embodiments, $\sigma_1$=0.73 ps/mm, $\sigma_2$=0.7 ps/mm, and $\sigma$=1.17 ps/mm. Then $\sigma_{12}=\sqrt{(\sigma_1^2+\sigma_2^2)}=1.01$. Although the percentage error of $\sigma_{12}$ with respect to $\sigma$ is 14%, difference in the absolute sigma values (i.e., 0.16 ps/mm) is only 0.19% of the mean delay (83.38 ps/mm). If PVTX variations increases, this error will further go down, strengthening the assumption. The standard deviations of the stages constituting a path may be combined as follows. If $S_1$ through $S_n$ are the stages on a path, with standard deviations $\sigma_1$ through $\sigma_n$ respectively, the jitter of the path may be given by $3\sqrt{\sum_{i=1}^{n}\sigma_i^2}$. Traditional STA would have computed the path jitter as $3\sum_{i=1}^{n}\sigma_i$, which is much higher than $3\sqrt{\sum_{i=1}^{n}\sigma_i^2}$. For instance, assume that a clock path has 10 identical stages, each with $\sigma$=10 ps. Traditional STA will compute 300 ps as the path jitter, whereas, in particular embodiments, statistical technique will compute it as $3\times\sqrt{10\times100}$=94.87 ps.

Figure 6:
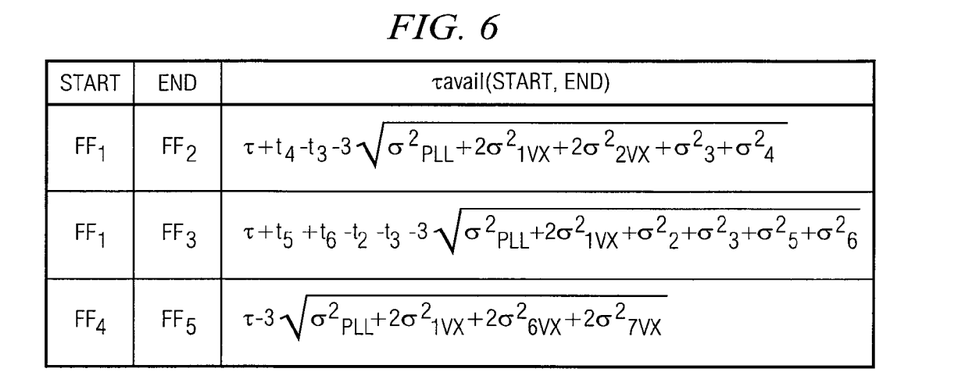
FIG. 6 illustrates example calculations for an example long path analysis.

Particular embodiments apply the statistical jitter methodology for timing analysis, e.g., long path and race analyses. For long path analysis, $\tau_{avail}(s,e)$, the minimum available cycle time for long path analysis corresponding to each data path ($FF_s$, $FF_e$) of FIG. 4, may be calculated. $\tau_{avail}(s,e)$ is an upper bound on the maximum delay of the combinational logic of the ($FF_s$, $FF_e$) path. FIG. 6 illustrates the calculation. For given start and end flops, $\tau_{avail}$ is calculated using Equation 2, i.e., by subtracting the nominal (mean) clock tree delay to the starting flip-flop and adding the nominal clock tree delay to the ending flip flop to the nominal clock cycle time $\tau$ and then subtracting the root-sum-square jitter of all components involved in the path. The jitter may be subtracted for computing the minimum value of the available cycle time. The term 3 before the square-root sign signifies use of a $3\sigma$ analysis for jitter. Note that, if there are buffers common to the clock paths between start and end FFs, e.g., buffers 12 and 14 for the start flop $FF_1$ and end flop $FF_2$, the sum of their mean delays $(t_1+t_2)$ appears in both paths and cancels out. However, the contribution of buffers 12 and 14 to the jitter is $3\times(2\sigma_{1V}x^2)$ and $3\times(2_{2VX}^2)$ respectively. The jitter contribution of a shared buffer is not zero. This is because in long path analysis, each shared buffer contributes its delay to $a_s$ in one cycle and to $a_e$ in the next clock cycle. These two delays could be different due to parameters changing with time. For shared buffers, particular embodiments include only the variation due to V X, since for a given buffer there is no process variation and the temperature should not change from one cycle to the next. Furthermore, the common buffers appear twice: one for the start flop and one for the end flop. So their squared jitter components are multiplied by 2. The PLL jitter $3\sigma_{PLL}$ may also be included. In contrast, an STA tool such as PrimeTime will compute $\tau_{avail}$ for the starting flip-flop $FF_1$ and the ending flip-flop $FF_2$ as $\tau - 3(2\sigma_{PLL}+2\sigma_1+2\sigma_2+\sigma_3+\sigma_4)$.

Figure 4:
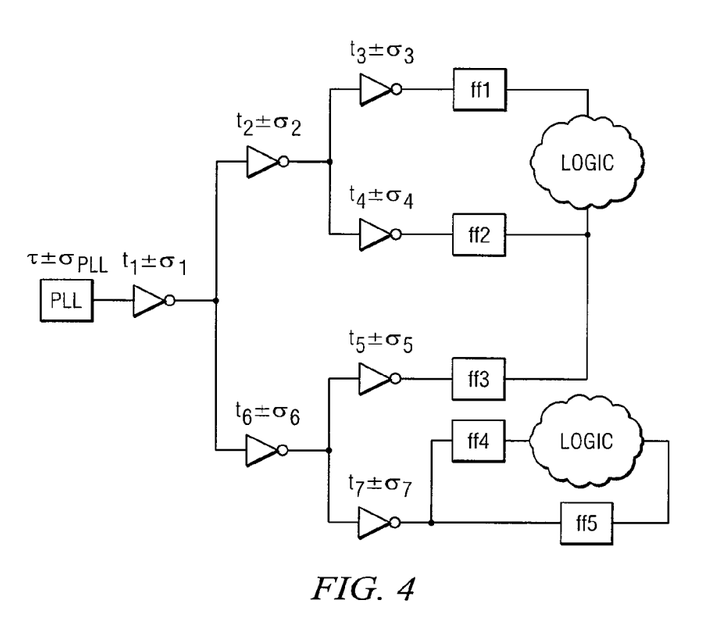
FIG. 4 illustrates an example clock tree.
Figure 5:
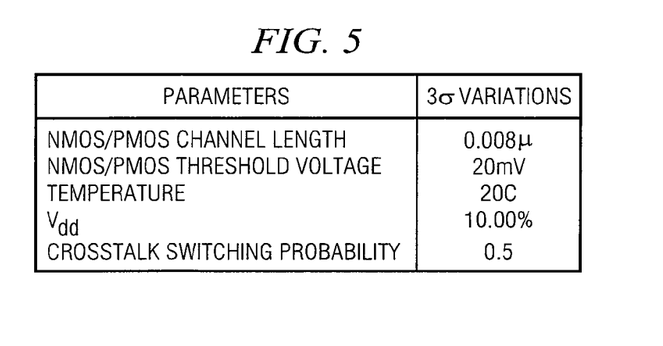
FIG. 5 illustrates example parameters of jitter variation.
Figure 7:
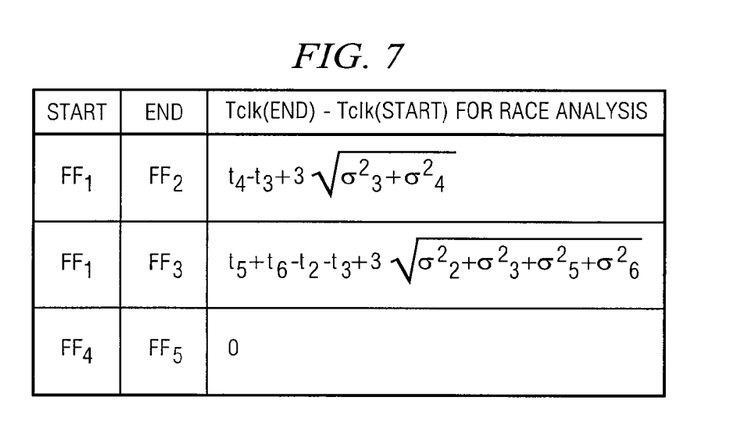
FIG. 7 illustrates example calculations for an example race analysis.

For race analysis, the maximum difference in the same-edge clock arrival times between the ending flip-flop and the starting flip-flop may be calculated for each path of FIG. 4. FIG. 7 illustrates the calculations. They may be calculated by subtracting the nominal clock delays of non-shared clock tree stages to the starting flip-flop from the clock delays of non-shared clock tree stages to the ending flip-flop and then adding the root-sum-square of the jitters of all non-shared clock tree stages in between the two paths. For race analysis, the jitter contribution of a shared buffer is zero, since only one clock cycle is involved in the analysis. Given a clock tree Q, the above methodology requires identification of all stages of Q and compute mean and jitter delay values for each stage using Monte Carlo simulation with SPICE. Although highly accurate, the methodology often tends to be computationally intensive. In a typical design, there are hundreds of thousands of FFs and thousands of buffers on the clock tree. Each buffer corresponds to a stage. Computationally, it may be unfeasible to carry out MCS for thousands of stages. In particular embodiments, a tree synthesis method addresses this issue.

Figure 8:
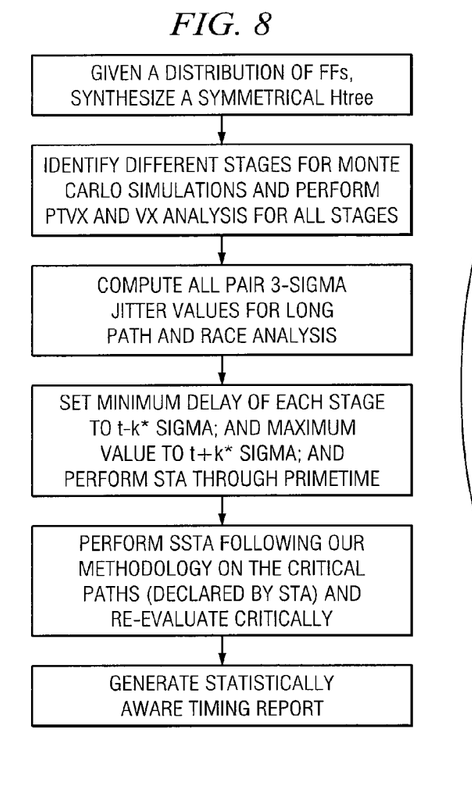
FIG. 8 illustrates an example method for clock tree synthesis and analysis.

FIG. 8 illustrates an example method for clock tree synthesis and analysis. The method is jitter and skew aware. The method uses one or more chip specifications (such as, for example, chip dimensions), FF locations, and one or more variation models. Although particular steps in the method illustrated in FIG. 8 are illustrated and described as occurring in a particular order, any suitable steps in the method illustrated in FIG. 8 may occur in any suitable order. One or more computer systems may facilitate execution of one or more steps in the method illustrated in FIG. 8. In general, jitter analysis of a clock tree Q using prior techniques is computationally intensive. However, the analysis may be more efficient if Q is completely symmetrical. In such a tree, any two paths from the clock source to the FF are substantially identical in terms of the sizes of the buffers and wire lengths between them. It then suffices to characterize the buffer stages only on one path of the tree for mean and sigma delay. Particular embodiments assume that variations in PVTX parameters are not a function of the location in the chip. This holds for particular variation models. If this assumption does not hold in the case of a certain variation model, stage jitter analysis of buffers on more than one path in the clock tree may be carried out. Thus, instead of carrying out MCS on thousands of stages for the entire tree, the problem reduces to MCS of at most approximately twenty or thirty stages, i.e., a maximum number of stages in a path. Another advantage of a perfectly symmetrical tree is that it has zero skew. So, particular embodiments adopt a synthesis methodology, wherein a symmetrical tree is generated. Particular embodiments employ an algorithm to synthesize a symmetrical clock tree as follows.

Figure 9:
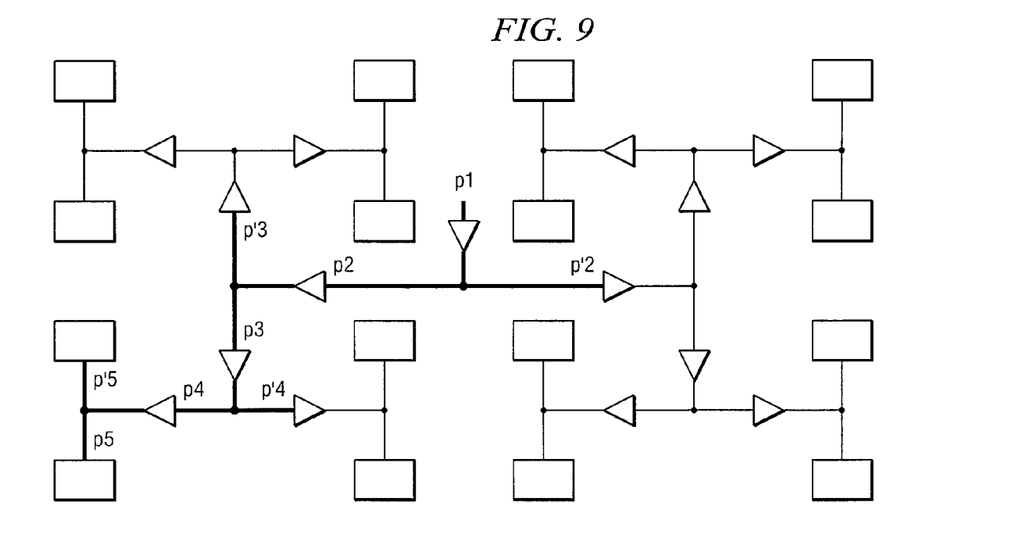
FIG. 9 illustrates example stages of paths from a clock source to flip flops (FFs)

Nonuniform (spatial) distribution of flip-flops on a chip tends to cause asymmetry in clock distribution. Particular embodiments address this nonuniformity by generating a symmetrical global H-tree driven by the clock source centered at the chip, followed by equally long connections to FFs from the sinks of the H-tree. Particular embodiments assign at most one FF to each sink. This determines the number of levels l of the H-tree. For instance, FIG. 9 illustrates example stages of paths from a clock source to FFs. More particularly, FIG. 9 illustrates a two-level tree with sixteen sinks. If n is the number of FFs in the design, $4^l \geq n$. $4^l$ is the number of sinks of the H-tree. An objective of the FF-to-sink assignment is to minimize the maximum distance between any sink s and the FF assigned to s. Let the maximum distance be D. Eventually, each sink will be connected to the assigned FF by an interconnect of length D. If the distance of some FF to its sink is less than D, particular embodiments use detours or jogs to make the interconnect length D. If there is a sink with no assigned FF, a dummy wire of length D is connected to it and a dummy capacitance $c_f$ is attached at the end of the interconnect, where $c_f$ is the input capacitance of the clock pin of the FF. For simplicity, particular embodiments assume that $C_f$ is identical for each FF. By minimizing the maximum distance between a sink and the assigned FF, the total interconnect length from the sinks to the FFs is also minimized.

In particular embodiments, by assigning at most one FF to each sink and making the length of the wire from each sink to the assigned FF identical, all H-tree sinks see a similar downstream topology: a wire of length D connected to a capacitance $c_f$. This enables generation of identical sections on the tree, i.e., given any two H-tree sinks $s_i$ and $s_j$, the paths from the clock-source to $s_i$ and $s_j$ are identical, including the number, locations, and sizes of buffers and repeaters.

In particular embodiments, the locations of FFs and H-tree sinks are known a priori. The locations of FFs are read in from the placement data. The locations of the H-tree sinks can be computed easily from the chip dimensions (height and width) and the number of levels of l of the tree. The top-level H is centered at the center of the chip, and its width and height are some fraction a of the chip height and width respectively. An H at a lower level has width and height equal to a times the width and height of the parent level. Typically, a=0.5.

Figure 10:
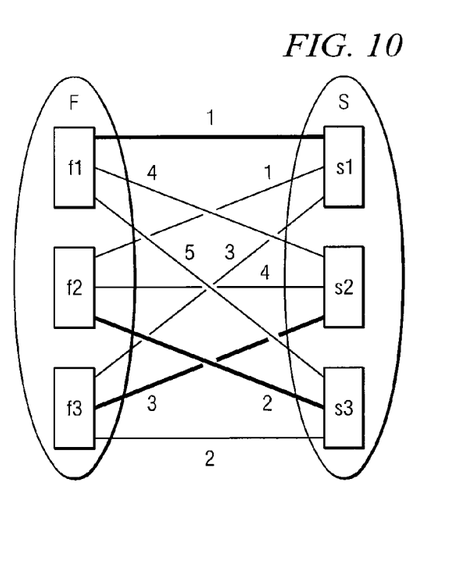
FIG. 10 illustrates an example complete bipartite graph.

In particular embodiments, an exact assignment of FFs to H-tree sinks may be determined by solving a perfect bottleneck matching problem in a bipartite graph G. A bipartite graph includes two disjoint sets F and S of vertices such that the only edges are between F and S. Each edge e has a weight w(e). A matching is a subset of the graph edges such that none of them share an endpoint. A perfect matching is a matching in which each vertex of the graph is an endpoint of some edge in the matching. In other words, a perfect matching covers all vertices. A condition for the existence of a perfect matching in a graph is that the two sets F and S have the same cardinality. The bottleneck matching problem aims to generate a matching whose maximum weight is minimum. FIG. 10 illustrates an example complete bipartite graph G with two sets F and S and edges with weights. A matching is shown in the bold. It consists of three edges $(f_1,s_1)$, $(f_2,s_3)$, and $(f_3,s_2)$, with weights 1, 2 and 3 respectively. This matching also happens to be the solution to the bottleneck matching problem. The weight of the maximum-weight edge in this matching is 3. Any other perfect matching in this graph cannot have maximum-weight edge with weight smaller than 3. The bottleneck matching problem may be solved exactly by invoking a perfect matching algorithm iteratively. In the iteration i, all edges in the graph with weight greater than $W_{i-1}$ are removed, where $W_{i-1}$ is the maximum-weight edge in the matching obtained in the iteration (i–1). A perfect matching may be obtained in the new graph. In particular embodiments, the algorithm terminates if a perfect matching can not be found: the last perfect matching yields the solution to the bottleneck matching problem. A binary search on edge weights may be used in addition to or as an alternative to the linear search.

In particular embodiments, in the case of FF and H-tree sink pairing problem, the sets F and S may be defined as follows. The set F corresponds to all the FFs and the set S to H-tree sinks. Dummy FF vertices are added to F to make the two sets have the same cardinality, so that a perfect matching solution exists. Given an FF $f$ and a sink s of the H-tree, there is an edge between $f$ and s, whose weight is the Manhattan distance between $f$ and s. The edges incident on dummy FFs have zero weight. The solution to the bottleneck matching problem in G will yield the desired FF and sink pairings.

Due to large size of G, the memory needed to store the edges exceeds the memory limit of the workstations. For a real design, S can have more than 1 million vertices. That implies more than 1000 billion edges in G. So particular embodiments use a heuristic that does not store the edges of the graph explicitly. The heuristic makes an initial matching by iterating over all FFs (in some order) and pairing a FF to the closest unpaired sink. Then, it enters an iterative improvement phase, in which it tries to replace the maximum weight edge $e_1=(f_1,s_1)$ in the matching. It does so by locating another edge $e_2=(f_2,s_2)$ belonging to the matching such that the weights of the edges $e_3=(f_1,s_2)$ and $e_4=(f_2,s_1)$ are less than that of $e_1$. If such an edge $e_2$ is found, $e_1$ and $e_2$ are removed from the matching, and $e_3$ and $e_4$ are added.

Particular embodiments use an H-tree generation program, which also inserts repeaters on the tree. The program may be modified to generate a symmetrical tree, so that each path from the clock source to a FF is identical in terms of the relative locations, sizes, and number of the buffers and repeaters, as well as the lengths of the interconnects.

In particular embodiments, a jitter analysis algorithm works on the symmetrical clock tree Q generated by the algorithm described above. A post-processing scheme to re-analyze the critical paths of the design (reported by traditional STA) using the statistically-computed jitter in Q may also be embedded in the analysis at the fourth and fifth steps below.
1. Perform a SPICE analysis of Q to determine transition times at the clock pins of all FFs.
2. As described above, the clock tree Q is symmetrical. So it suffices to consider just one path P in Q for jitter analysis. P starts at the clock source and ends at an arbitrarily chosen FF. P is decomposed into stages or sections. A stage $S_i$ starts at the input pin $p_i$ of a buffer or repeater on P and terminates at the first downstream buffer, repeater or FF $p_{i+1}$ on P. It also includes a branch (if any) between $p_i$ and $p_{i+1}$, up to the first buffer/repeater/FF. FIG. 9 shows the stages of the path P which starts at the clock source $p_i$ and terminates at FF $p_5$. For simplicity, FFs are shown to coincide with H-tree sinks. P has four stages. For each i from 1 to 4, the stage $S_i$ starts at $p_i$ and ends at $p_{i+1}$, and also includes the fanout branch up to $p_{i+1}$. Given the clock tree, determine stages $S_i$ for a path, carry out MCS on each $S_i$ and determine mean and sigma delays $(t_i,\sigma_i)$. If $S_i$ has a branching node n with no buffer, the delays of all sub-stages in $S_i$ are computed, including the delay from the driving buffer up to n and the delay from n to its fanouts. The delay of a stage $S_i$ is a function of the capacitive load at $p_{i+1}$ and the input slew at $p_i$. Slew variations should not be ignored. So for each stage, slew distribution is computed during MCS (Oust like delay distribution) and used as an input Oust like PVTX variations) while the next stage is characterized for delay and slew. To propagate the slew distribution, stages are traversed and characterized in a topological order: from the clock root to the sinks. Also, two kinds of MCSs may be performed for each $S_i$: one that includes all PVTX variations and the other with only VX variations.
3. Using $(t_i,\sigma_i)$, set the minimum delay of $S_i$ to $t_i-k^*\sigma_i$ and maximum delay to $t_i+k^*\sigma_i$ (k is usually between 3 and 6). Perform a min-max analysis on the tree to determine minimum and maximum latencies at all FF clock pins. This may be done by adding the stage delays on each path. This may mimic PrimeTime's delay calculations. Particular embodiments may use k=3.
4. Invoke a static timing analysis tool (such as PrimeTime) with the min and max latencies and transition times at FF clock pins, computed in the last three steps. Generate all the critical data paths.
5. For each critical path which starts at a FF and terminates at a FF, re-analyze the clock paths to the corresponding source and target FFs using the jitter methodology described above. This methodology uses statistical analysis (instead of the worst case analysis in tools such as PrimeTime) to compute arrival times at the clock pins of the two FFs. Re-evaluate if the path is still critical using the new arrival times, and remove it from consideration if it is not.

In particular embodiments, an all-pair jitter analysis program computes 3σ jitter values for all FF pairs in the clock tree Q. Given a data path P that starts at $FF_s$ and ends at $FF_e$, identify the two paths $P_s$ and $P_e$ in Q from the clock root to $FF_s$ and $FF_e$ respectively. Beginning at the clock root, $P_s$ and $P_e$ will share some stages and then diverge. Q being symmetrical, the non-shared paths are identical in terms of the number of inverters, their sizes and the lengths of the corresponding line segments. Then, plugging the σ values for each stage in the expressions similar to those illustrated in FIG. 6, particular embodiments may compute the total clock jitter for P. If q is the number of stages on a path in Q, only (q+1) different jitter values exist. These correspond to $P_s$ and $P_e$ sharing i stages, i=0 to q. Due to Q's symmetry and the location-independent variations model used, all FF pairs that share first i stages have identical jitter values. This utility may be executed relatively quickly due to the symmetry of Q. A similar utility may be used for race analysis.

Particular embodiments provide a clock tree analysis methodology that includes the effect of jitter sources such as variations in $V_{dd}$, temperature, process, and crosstalk noise. Particular embodiments rely on analyzing each buffer stage accurately for mean delay and jitter with Monte Carlo analysis using SPICE, with all jitter source models included. Particular embodiments are statistical, as opposed to worst-case, and combine jitters of the individual stages as root sum squares instead of simply adding them (as done by STA tools). Particular embodiments propose a synthesis algorithm for generating a completely symmetrical tree, for which stage and path jitters can be computed extremely efficiently.

More realistic models of P, V, and T variations may be incorporated into particular embodiments. One way to improve V and T modeling is described above. The process variations may be first split into systematic and random and then modeled appropriately.

Particular embodiments assign one FF to each H-tree sink. If the number of unassigned sinks is large, significant wiring resources and power may be wasted. A methodology may group and assign multiple FFs to one sink, but still yield an almost symmetrical tree.

In particular embodiments, a symmetrical tree, although good for low skew and efficient jitter analysis, may waste wiring and power. Also, it may be difficult to generate a completely symmetrical tree, for instance, in the presence of obstructions such as RAMs and third-party IPs. Moreover, if any of PVTX variations is a function of the location of the device on the chip (e.g., crosstalk noise), particular embodiments may accommodate such variations. An efficient and accurate methodology for jitter analysis on a general clock tree under a broader PVTX variation model may be used.

Particular embodiments have been used to describe the present invention, and a person having skill in the art may comprehend one or more changes, substitutions, variations, alterations, or modifications within the scope of the appended claims. The present invention encompasses all such changes, substitutions, variations, alterations, and modifications.

What is claimed is:

1. A method comprising:
    dividing by one or more computer systems a clock tree into a plurality of stages;
    computing by the one or more computer systems jitter in one or more of the stages according to a model of at least a portion of a circuit associated with the clock tree, the model comprising a representation of each source of jitter in the circuit; and
    to compute jitter associated with a path or a pair of paths in the clock tree, statistically combining by the one or more computer systems the jitter in each of the stages of the path or the pair of paths in the clock tree with each other.

2. The method of claim 1, further comprising using by the one or more computer systems the jitter associated with the path or the pair of paths in the clock to perform long path and race timing analyses on the clock tree.

3. The method of claim 1:
    wherein two or more stages of the clock tree are approximately electrically equivalent to each other; and
    computing jitter in the approximately electrically equivalent stages comprises computing jitter in only one of the approximately electrically equivalent stages, the jitter in each of the approximately electrically equivalent stages being approximately equal to each other as a result of the approximate electrical equivalence.

4. The method of claim 3, wherein the computed jitter is a worst-case jitter associated with all paths or all pairs of paths in the clock tree.

5. The method of claim 1, further comprising:
    running by the one or more computer systems a static timing analysis (STA) on the circuit, the STA generating a first list of a first number of critical paths in the circuit; and
    using output of the STA, correcting by the one or more computer systems one or more clock arrival times at one or more flip-flops in the circuit according to the computed jitter associated with a path or a pair of paths in the clock tree; and
    generating by the one or more computer systems a second list of a second number of critical paths in the circuit, the second number being smaller than or equal to the first number.

6. The method of claim 1, wherein the jitter in a stage is computed using SPICE with Monte Carlo simulations.

7. The method of claim 6, wherein for a path having n stages with standard deviations $\sigma_1$ through $\sigma_n$ respectively, the jitter associated with the path is $3\sqrt{\Sigma_{i=1}^{n}\sigma_i^2}$.

8. Logic encoded in no-transitory computer-readable media for execution and when executed operable to:
    divide a clock tree into a plurality of stages;
    compute jitter in one or more of the stages according to a model of at least a portion of a circuit associated with the clock tree, the model comprising a representation of each source of jitter in the circuit; and
    to compute jitter associated with a path or a pair of paths in the clock tree, statistically combine the jitter in each of the stages of the path or the pair of paths in the clock tree with each other.

9. The logic of claim 8, further operable to use the jitter associated with the path or the pair of paths in the clock tree to perform long path and race timing analyses on the clock tree.

10. The logic of claim 8:
    wherein two or more stages of the clock tree are approximately electrically equivalent to each other; and
    computing jitter in the approximately electrically equivalent stages comprises computing jitter in only one of the approximately electrically equivalent stages, the jitter in each of the approximately electrically equivalent stages being approximately equal to each other as a result of the approximate electrical equivalence.

11. The logic of claim 10, wherein the computed jitter is a worst-case jitter associated with all paths or all pairs of paths in the clock tree.

12. The logic of claim 8, further operable to:
    run a static timing analysis (STA) on the circuit, the STA generating a first list of a first number of critical paths in the circuit; and
    using output of the STA, correct one or more clock arrival times at one or more flip-flops in the circuit according to the computed jitter associated with a path or a pair of paths in the clock tree; and
    generate a second list of a second number of critical paths in the circuit, the second number being smaller than or equal to the first number.

13. A system comprising:
    means for dividing a clock tree into a plurality of stages;
    means for computing jitter in one or more of the stages according to a model of at least a portion of a circuit associated with the clock tree, the model comprising a representation of each source of jitter in the circuit; and
    to compute jitter associated with a path or a pair of paths in the clock tree, means for statistically combining the jitter in each of the stages of the path or the pair of paths in the clock tree with each other.

* * * * *